United States Patent [19]

Kan et al.

[11] Patent Number: 5,337,326
[45] Date of Patent: Aug. 9, 1994

[54] SEMICONDUCTOR LASER DEVICE WITH COMPRESSIVELY STRESSED BARRIER LAYER

[75] Inventors: Yasuo Kan; Kosei Takahashi, both of Nara; Masahiro Hosoda, Kashiba; Atsuo Tsunoda, Yamatokoriyama; Kentaro Tani, Tenri; Masanori Watanabe, Nara, all of Japan

[73] Assignee: Sharp Kabushiki Kaisha, Osaka, Japan

[21] Appl. No.: 953,458

[22] Filed: Sep. 29, 1992

[30] Foreign Application Priority Data

Dec. 20, 1991 [JP] Japan ................... 3-338806

[51] Int. Cl.$^5$ ................................ H01S 3/19
[52] U.S. Cl. ................................ 372/45
[58] Field of Search ............... 372/43, 45, 50

[56] References Cited

U.S. PATENT DOCUMENTS

| | | | |
|---|---|---|---|
| 4,769,821 | 9/1988 | Gatoh | 372/45 |
| 4,804,639 | 2/1989 | Yablonovitch | 372/45 |
| 4,841,531 | 6/1989 | Kondow et al. | 372/45 |
| 4,982,242 | 1/1991 | Scifres et al. | |
| 5,202,895 | 4/1993 | Nitta et al. | 372/45 |
| 5,272,712 | 12/1993 | Arimoto et al. | 372/45 |
| 5,274,656 | 12/1993 | Yoshida | 372/45 |
| 5,276,698 | 1/1994 | Yoshida et al. | 372/45 |
| 5,282,218 | 1/1994 | Okajima et al. | 372/45 |

FOREIGN PATENT DOCUMENTS

| | | |
|---|---|---|
| 0069608 | 1/1983 | European Pat. Off. . |
| 0521395 | 1/1993 | European Pat. Off. . |

OTHER PUBLICATIONS

Itaya et al., *Extended Abstracts of the 22nd (1990 International) Conference on Solid State Devices and Materials*, Sendai, 1990, pp. 565–568 No month available.
Katsuyama et al., *Extended Abstracts (The 52nd Autumn Meeting, Oct. 1991); The Japan Society of Applied Physics*, 9P-ZM-12.
*Patent Abstracts of Japan*, vol. 8, No. 74, (E-236) Apr. 6, 1984. A copy of the corresponding Japanese Patent Publication No. 58-222577 is also attached.
*Patent Abstracts of Japan* vol. 10, No. 145, (E-407) May 28, 1986. A copy of the corresponding Japanese Patent Publication No. 61-007674 is also attached.
*Patent Abstracts of Japan* vol. 12, No. 385, (E-668) Oct. 14, 1988. A copy of the corresponding Japanese Patent Publication No. 63-128785 is also attached.
*Patent Abstracts of Japan* vol. 12, No. 310, (E-648) Aug. 23, 1988. A copy of the corresponding Japanese Patent Publication No. 63-077182 is also attached.
Thijs et al., "High-performance 1.5 μm wavelength InGaAs-InGaAsP strained quantum well lasers and amplifiers" *IEEE Journal of Quantum Electronics* (Jun. 1991) 27(6):1426–1439.
Nitta et al., "High-temperature operation of high-power InGaAlP visible light laser diodes with an $In_{0.5+\delta}Ga_{0.5-\delta}P$ active layer" *Applied Physics Letters* (Jul. 1991) 59(2):149–151.

Primary Examiner—Rodney B. Bovernick
Assistant Examiner—Robert McNutt
Attorney, Agent, or Firm—Morrison & Foerster

[57] ABSTRACT

A semiconductor laser device includes a substrate; a double hetero structure having an n-type cladding layer, an active layer, and a p-type cladding layer, which is formed on an upper face of the substrate; and electrodes formed on a lower face of the substrate and on an upper face of the double hetero structure, wherein the double hetero structure further includes a p-type hetero-barrier layer formed between the p-type cladding layer and the active layer, which is strained by compression due to a lattice mismatch.

7 Claims, 6 Drawing Sheets

SEMICONDUCTOR LASER DEVICE WITH COMPRESSIVELY STRESSED BARRIER LAYER

BACKGROUND OF THE INVENTION

1. Field of the Invention

The present invention relates to a semiconductor laser device, and more particularly to a semiconductor laser device in which the overflow of the carriers is reduced.

2. Description of the Prior Art

In recent years, the development of semiconductor laser devices having advantages such as being of a small-size, having a high conversion efficiency, and available at a moderate price has advanced the application of lasers to industrial machines and household machines.

Semiconductor laser devices have been applied in a number of fields, such as optical communication and a light source for reading data from an optical disk. It is expected that improvement in properties of semiconductor laser devices will contribute to further enlargement in the range of their application. For example, as a light source for writing data on an optical disk, a semiconductor laser which operates with higher output, oscillates at a shorter wavelength and thus enables higher recording density is required.

FIG. 3 shows an example of a conventional semiconductor laser device 300 of a gain waveguide type using an AlGaInP crystal. The semiconductor laser device 300 has a separate confinement heterostructure including an active layer 35 with a quantum well structure.

The semiconductor laser device 300 has an n-type GaAs substrate 31, an n-type $Ga_{0.51}In_{0.49}P$ buffer layer 32, an n-type $Al_{0.51}In_{0.49}P$ cladding layer 33, and an undoped $(Al_{0.6}Ga_{0.4})_{0.51}In_{0.49}$ side barrier layer 34, a $Ga_{0.51}In_{0.49}P$ quantum well active layer 35, an undoped $(Al_{0.6}Ga_{0.4})_{0.51}In_{0.49}P$ side barrier layer 37, a p-type $Al_{0.51}In_{0.49}P$ cladding layer 38, a p-type $Ga_{0.51}In_{0.49}P$ intermediate layer 39, and a p-type GaAs contact layer 310, which are layered in this order from the lowest side. Each crystal layer is successively grown by molecular beam epitaxy. The semiconductor laser device 300 also has a silicon nitride film 313, an Au-Ge-Ni electrode 311 and an Au-Ge-Ni electrode 312.

FIG. 4a shows an energy band structure in the case where a forward bias is applied to the semiconductor laser device 300 so as to inject into the active layer 35 a current of the order of a threshold value for laser oscillation. The difference in energy between the active layer 35 and the side barrier layer 37 is not satisfactory for reducing the overflow of the carriers, especially electrons injected into the active layer 35. Under the condition that carriers are excessively injected into the active layer 35, electrons are leaked out of the active layer 35, as illustrated in FIG. 4b, causing an increase in the threshold current.

In order to reduce the overflow of the electrons from the active layer 35, it is required to change the composition of the side barrier layer 37 so as to increase the difference in energy of the conduction band between the active layer 35 and the side barrier layer 37. However, energy difference cannot be made larger than a limited value. For example, in the case of a $Ga_{0.51}In_{0.49}P/(Al_xGa_{1-x})_{0.51}In_{0.49}P$ heterojunction, the maximum difference in energy at $x=0.7$ is about 0.15 eV. Another way to reduce the electron overflow is to dope the side barrier layer 37, thereby increasing the energy level of the valence band thereof. A closely related study is described in Extended Abstracts of the 22nd (1990 International) Conference on Solid State Devices and Materials, Sendai, pp. 565–568. FIG. 5 shows an energy band structure in the case where the side barrier layers 34 and 37 are doped in the semiconductor laser device 300 of FIG. 3. As seen from FIG. 5, a potential barrier to the electrons in the active layer 35 can be substantially made higher. More specifically, by doping the side barrier layer 37, a reverse potential gradient is formed against the leaked electrons in the portion of the side barrier layer 37 in the vicinity of the active layer 35 whereby reducing the overflow of the electrons.

FIG. 6 is a view showing the height of the potential barrier to the electrons, in which $\Delta Ec$ is the original energy difference of the conduction band and $\delta Ec$ is the energy difference generated by doping the side barrier layer. The height of the potential barrier is determined by the bandgap energy Egb and the quasi-Fermi level $E_{FVb}$ of the p-doped side barrier layer. In FIG. 6, the quasi-Fermi level $E_{FVb}$ is expressed as an increase in a potential with respect to the holes, the top of the valence band being the standard. The greater the bandgap energy Egb becomes, and the further the quasi-Fermi level $E_{FVb}$ enters into the valence band, the greater the energy difference $\delta Ec$ becomes.

However, since the effective mass of the hole is usually larger than that of the electron, the quasi-Fermi level $E_{FVb}$ of the holes even at the increased carrier concentration, does not easily enter into the valence band as the quasi-Fermi level $E_{FVb}$ of the electrons enter into the conduction band. FIG. 7 shows the difference with respect to the carrier concentration between the quasi-Fermi level of the holes and that of the electrons in case of GaAs, and the similar tendency is generally observed in the other semiconductor materials. Accordingly, the potential barrier cannot be easily made high by doping the side barrier layer. In addition, when the composition itself of the side barrier layer is changed so as to increase the bandgap energy Egb, for example, the ratio of Al is increased in an AlGaAs mixed crystal on an AlGaInP mixed crystal, the bandgap energy Egb reaches the maximum at the point where the energy difference of the indirect transition becomes smaller than that of the direct transition, and cannot be made larger anymore even by further changing the composition.

SUMMARY OF THE INVENTION

The semiconductor laser device of this invention comprises a substrate; a double hereto structure including an n-type cladding layer, an active layer, and a p-type cladding layer which are formed on an upper face of the substrate; and electrodes formed on a lower face of the substrate and on an upper face of the double hetero structure, wherein the double hetero structure further includes a p-type hetero-barrier layer formed between the p-type cladding layer and the active layer, and the p-type hereto-barrier layer is strained by compression due to a lattice mismatch.

Alternatively, the semiconductor laser device of this invention comprises an n-type substrate; an n-type cladding layer formed on an upper face of the n-type substrate; an n-type side barrier layer formed on an upper face of the n-type cladding layer; an undoped active layer with a quantum well structure, formed on an upper face of the n-type side barrier layer; a p-type hereto-barrier layer formed on an upper face of the undoped active layer; a p-type side barrier layer formed on an upper face of the p-type hetero-barrier layer; a p-type cladding layer formed on an upper face of the p-type side barrier layer; a p-type contact layer formed on an upper face of the p-type cladding layer; and electrodes formed on a lower face of the n-type substrate and on an upper face of the p-type contact layer, wherein the p-type hereto-barrier layer is strained by compression due to a lattice mismatch.

Thus, the invention described herein makes possible the advantage of providing a semiconductor laser device in which a potential barrier to electrons in an active layer is increased and thus carrier overflow which hinders high output operation of the laser device is reduced.

These and other advantages of the present invention will become apparent to those skilled in the art upon reading and understanding the following detailed description with reference to the accompanying figures.

DESCRIPTION OF THE PREFERRED EMBODIMENTS

In the semiconductor laser device according to the present invention, a mixed crystal strained by compression is used as a p-type hereto-barrier layer which is disposed in contact with an active layer, whereby increasing the potential barrier to the electrons in the active layer.

Figure 8:
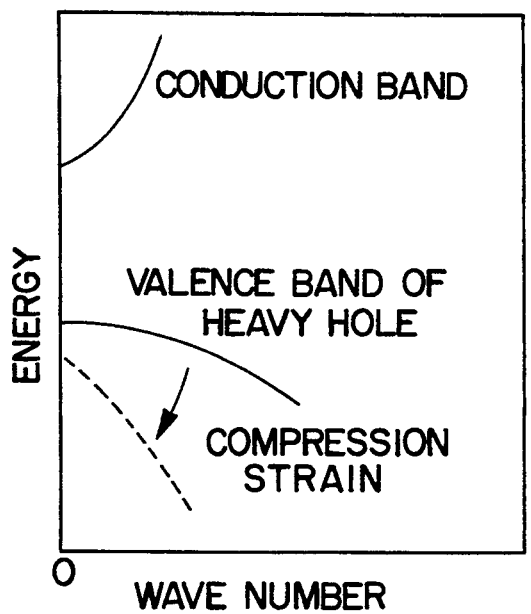
FIG. 8 is a graph showing a change in an energy band structure caused by the compression strain.

FIG. 8 shows that, when a mixed crystal is strained by compression, the bandgap energy Egb is increased compared with that in a non-strain state. In FIG. 8, the conduction band is supposed to be constant and the relative decrease in the valence band of the heavy holes is shown. In addition to the above effect, the compression strain has great effects on the structure of a valence band; in particular, the effective mass of a heavy hole situated at the highest energy position of the valence band is decreased, and thus a state density thereof is decreased. As a result, when a mixed crystal is strained by compression, the quasi-Fermi level of the holes deeply enters into the valence band, compared with the case when the mixed crystal is doped with the same amount of dopants but is not strained. Thus, the compression strain applied to a mixed crystal decreases the effective mass of the holes in the valence band, and makes the quasi-Fermi level of the holes enter into the valence band even when the carrier density is low. These effects are known robe applied for a semiconductor laser device having an active layer strained by compression, in which the Bernard-Duraffourg condition is satisfied with low carrier density, whereby the threshold current for laser oscillation can be reduced. Extended Abstracts (The 52nd Autumn Meeting, 1991); The Japan Society of Applied Physics, 9p-ZM-12, p. 976.

Figure 9:
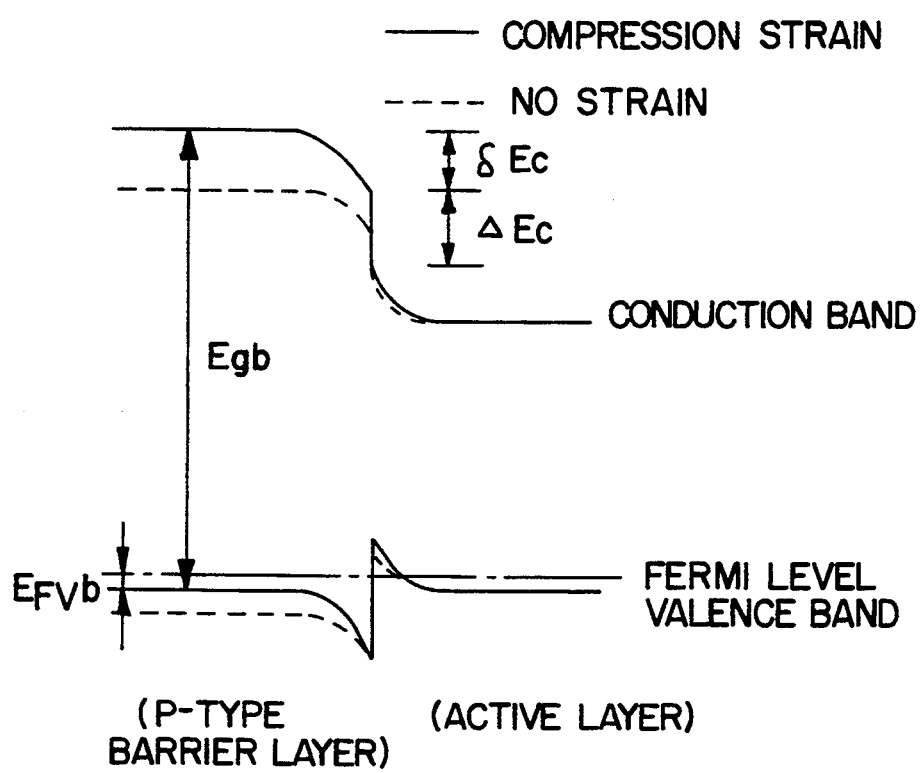
FIG. 9 is a graph showing a change in an energy band structure in the vicinity of an active layer in the case where a mixed crystal strained by compression is formed as a hereto-barrier layer between the active layer and the p-type side barrier layer.

FIG. 9 shows an energy band structure in the vicinity of the active layer when a mixed crystal strained by compression is used as a hetero-barrier layer disposed in contact with an active layer. In FIG. 9, $\Delta$ Ec is the original energy difference of the conduction band and $\delta$Ec is the energy difference generated by the compression strain. Because of the compression strain, the bandgap energy Egb and the quasi-Fermi level $E_{FVb}$ of the hetero-barrier layer are increased, and the height of the substantial barrier which is expressed as $\Delta + \delta$Ec can be increased. Here, it is required that the thickness of the side barrier layer strained by compression is equal to or less than that of a critical thickness so as not to cause transition defects due to strain. For example, when the hereto-barrier layer is to be formed of AlGaInP strained by compression due to a lattice mismatch of 1%, the thickness of up to about 30 nm can be realized. This thickness is sufficient for securing a substantially high potential barrier to the electrons.

EXAMPLES

Hereinafter, the present invention will be described by way of illustrating examples.

Figure 1:
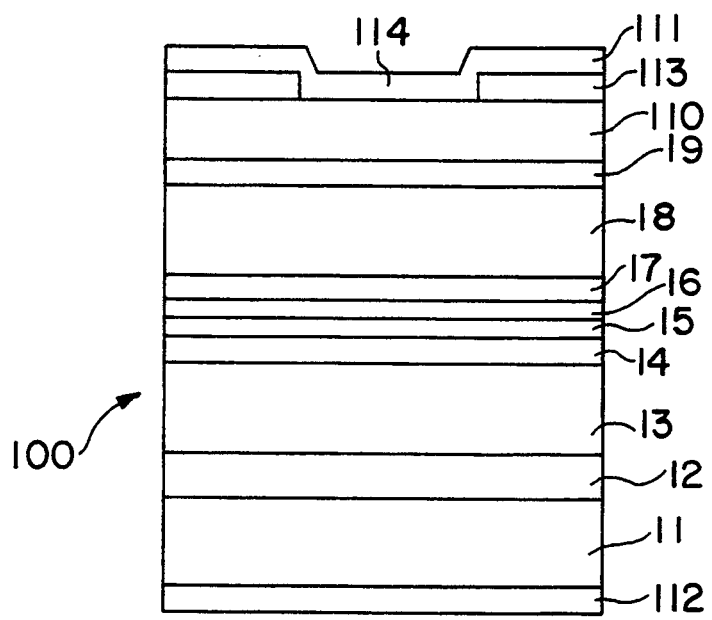
FIG. 1 is a cross-sectional view showing an example of an AlGaInP semiconductor laser device according to the present invention.

FIG. 1 is a cross-sectional view showing an example of a visible light semiconductor laser device of a gain waveguide type 100, in which an active layer 15 has a $Ga_{0.5}In_{0.5}P$ quantum well structure.

The semiconductor laser device 100 has been formed as follows. On an n-type GaAs substrate 11, an n-type $Ga_{0.51}In_{0.49}P$ buffer layer 12 (0.5 $\mu$m in thickness), an n-type $Al_{0.51}In_{0.49}P$ cladding layer 13 (1.0 $\mu$m in thickness), an n-type $(Al_{0.55}Ga_{0.45})_{0.51}In_{0.49}P$ side barrier layer 14 (60 nm in thickness), an undoped $Ga_{0.5}In_{0.5}P$ quantum well active layer 15 (10 nm in thickness), a p-type $Al_{0.4}In_{0.6}P$ strained hetero-barrier layer 16 (20 nm in thickness), a p-type $(Al_{0.55}Ga_{0.45})_{0.51}In_{0.49}P$ side barrier layer 17 (40 nm in thickness), a p-type $Al_{0.51}In_{0.49}P$ cladding layer 18 (0.8 $\mu$m in thickness), a p-type $Ga_{0.51}In_{0.49}P$ intermediate layer 19 (50 nm in thickness), and a p-type GaAs contact layer 110 (0.5 $\mu$m in thickness) are successively layered in this order.

Each of the above semiconductor layers is grown by molecular beam epitaxy. On the surface of the contact layer 110, a silicon nitride film 113 is formed. A window region 114 is formed in the silicon nitride film 113 by using photolithography, so as to expose a surface of the contact layer 110. Then, an Au-Zn electrode 111 is layered on the surface of the silicon nitride film 113 and the exposed surface of the contact layer 110. Further, an Au-Ge-Ni electrode 112 is formed on the rear face of the substrate 11, thereby obtaining the semiconductor laser device 100.

The buffer layer 12, the cladding layer 13, the side barrier layer 14, the active layer 15, the side barrier layer 17, the cladding layer 18, and the intermediate layer 19, all of which are AlGaInP mixed crystal layers, respectively have a composition which lattice-matches with GaAs. The p-type hetero-barrier layer 16 alone has a lattice mismatch of approximately 0.9% with respect to the active layer 15 and is thus strained by compression. In this specification, the lattice mismatch means the ratio of the lattice constant of one semiconductor layer to that of another semiconductor layer.

The bandgap energy of the p-type hetero-barrier layer 16, if it is not strained by compression, is the same as those of the side barrier layers 14 and 17, which is about 2.25 eV in a direct transition region. The bandgap energy of the p-type hetero-barrier layer 16 strained by compression is larger than 2.25 eV.

Figure 2:
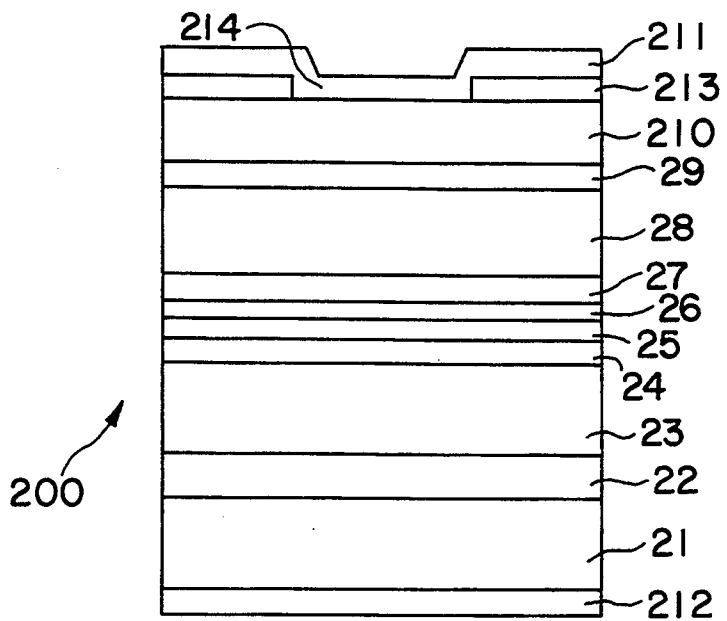
FIG. 2 is a cross-sectional view showing another example of the AlGaInP semiconductor laser device according to the present invention.
Figure 3:
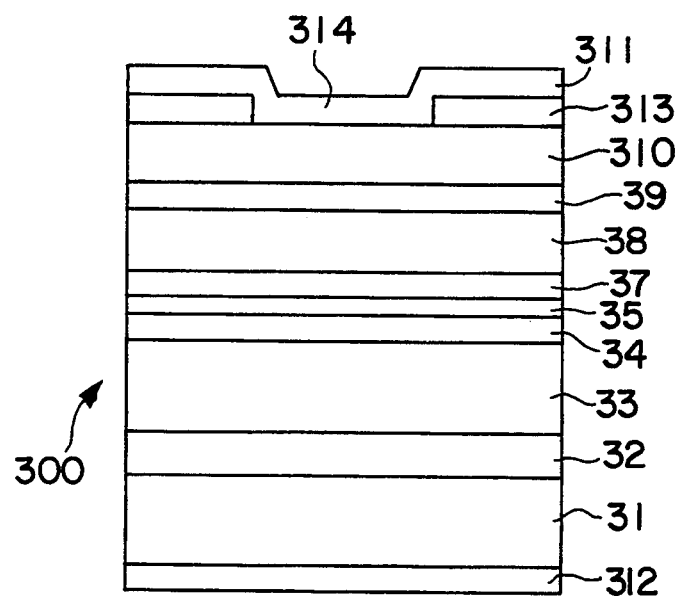
FIG. 3 is a cross-sectional view showing a conventional AlGaInP semiconductor laser device.
Figure 4A:
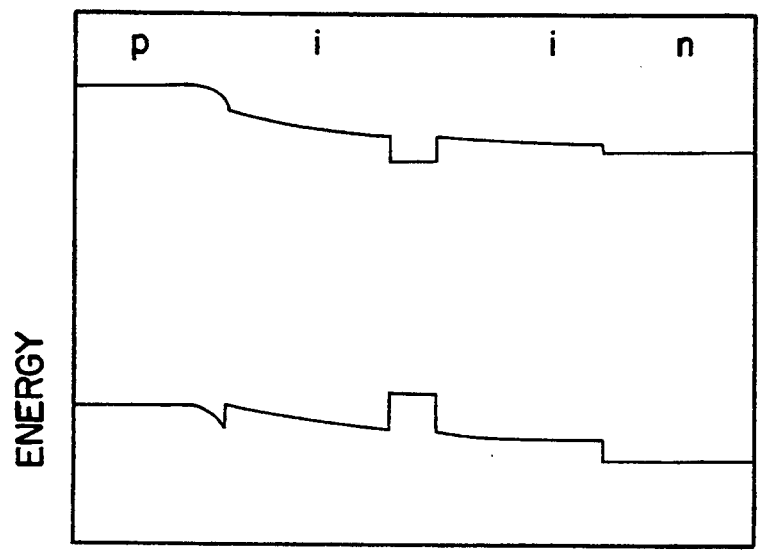
FIG. 4a is a graph showing an energy band structure in the vicinity of the active layer of the semiconductor laser device of FIG. 3.
Figure 4B:
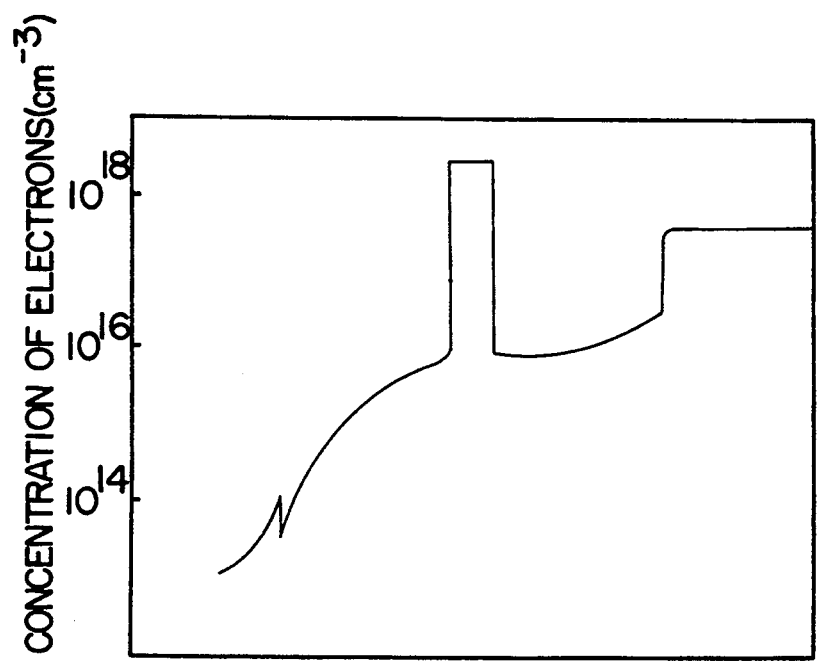
FIG. 4b is a graph showing a distribution of electrons in the vicinity of the active layer of the semiconductor laser device of FIG. 3.
Figure 5:
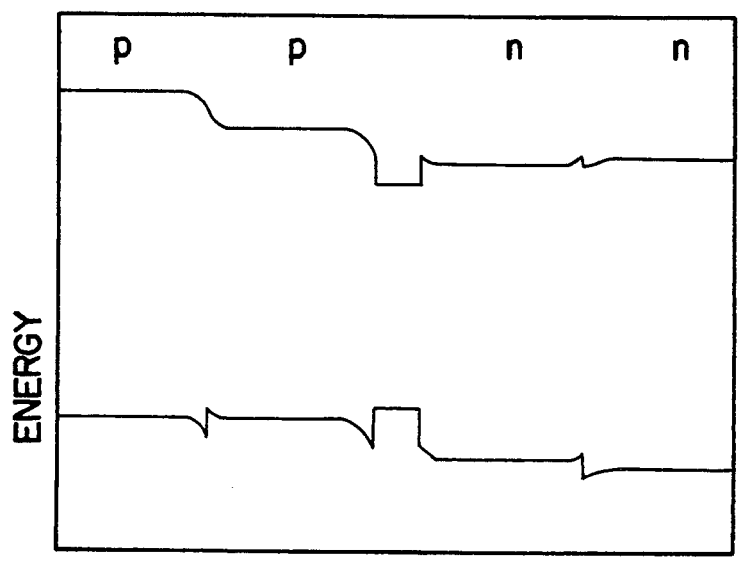
FIG. 5 is a graph showing an energy band structure in the case where the side barrier layer between the active layer and the p-type cladding layer is doped in the semiconductor laser device of FIG. 3.
Figure 6:
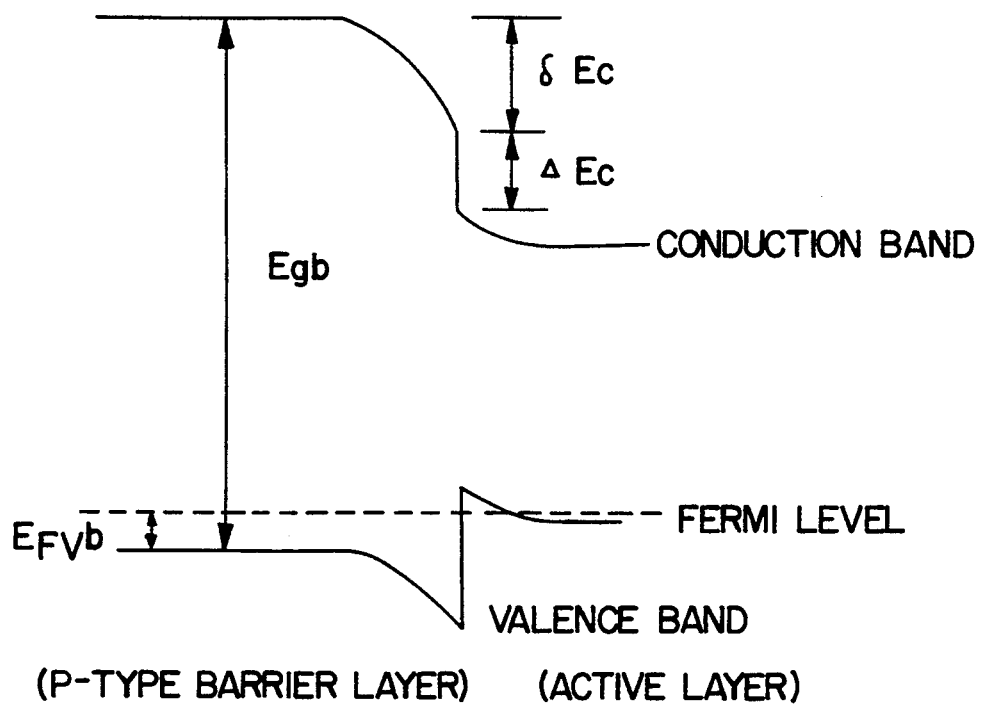
FIG. 6 is a graph showing a height of a substantial potential barrier to electrons.
Figure 7:
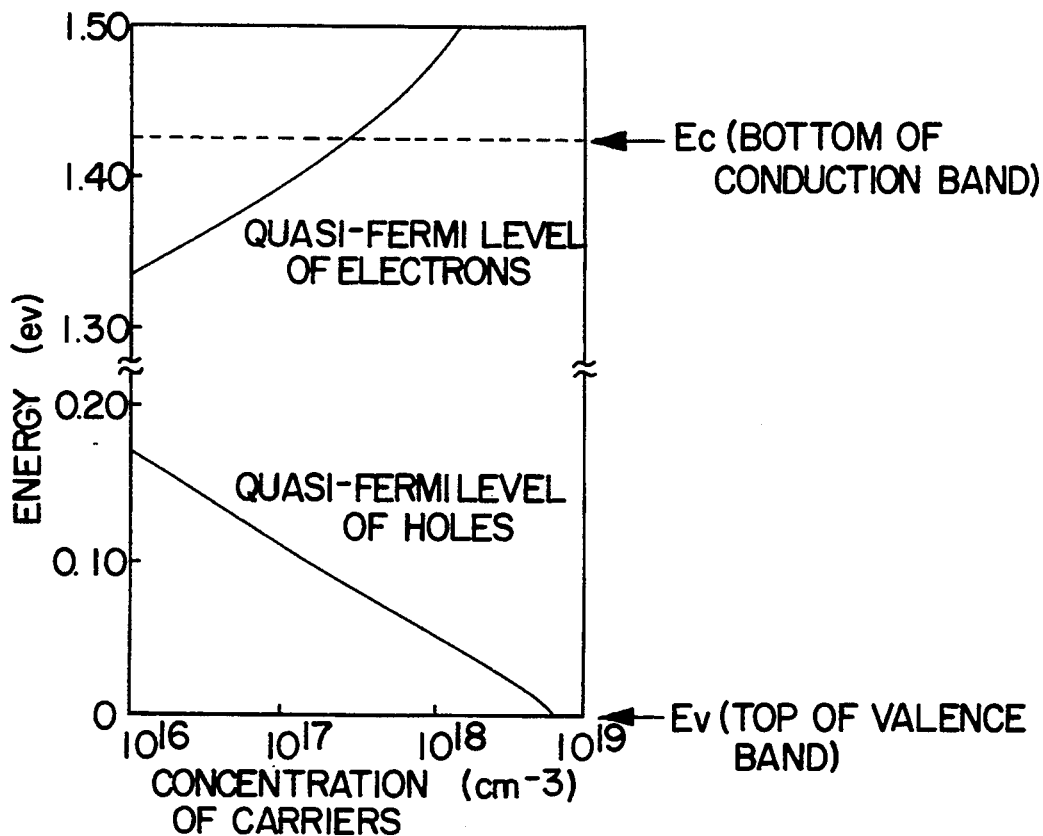
FIG. 7 is a graph showing the difference between the quasi-Fermi level of the electrons and the quasi-Fermi level of the holes with respect to the concentration of carriers in GaAs.

FIG. 2 is a cross-sectional view showing another example of a visible light semiconductor laser device of a gain waveguide type 200. In this device, an active layer 25 has a $Ga_{0.55}In_{0.45}P$ quantum well structure.

The semiconductor laser device 200 has been formed as follows. On an n-type GaAs substrate 21, an n-type $Ga_{0.51}In_{0.49}P$ buffer layer 22 (0.5 μm in thickness), an n-type $Al_{0.51}In_{0.49}P$ cladding layer 23 (1.0 μm in thickness), and an n-type $(Al_{0.55}Ga_{0.45})_{0.51}In_{0.49}P$ side barrier layer 24 (60 nm in thickness), an undoped $Ga_{0.55}In_{0.45}P$ quantum well active layer 25 (10 nm in thickness), a p-type $Al_{0.4}In_{0.6}P$ hetero-barrier layer 26 (20 nm in thickness), a p-type $(Al_{0.55}Ga_{0.45})_{0.51}In_{0.49}P$ side barrier layer 27 (4.0 nm in thickness), a p-type $Al_{0.51}In_{0.49}P$ cladding layer 28 (0.8 μm in thickness), a p-type $Ga_{0.51}In_{0.49}P$ intermediate layer 29 (50 nm in thickness) and a p-type GaAs contact layer 210 (0.5 μm in thickness) are successively grown in this order by molecular beam epitaxy. A silicon nitride film 213, an Au-Zn electrode 211 and an Au-Ge-Ni electrode 212 are formed in a manner similar to the case of the semiconductor laser device 100.

In the semiconductor laser device 200 produced as above, the hetero-barrier layer 26 has a lattice mismatch of approximately 0.5% with respect to the active layer 25, and thus has an increased bandgap energy due to the compression strain.

In the above examples, the semiconductor laser device having the GaInP quantum well active layer and the AlInP hereto-barrier layer is described. Alternatively, the semiconductor laser device of the present invention may include a double-heterostructure having an active layer made of usual bulk instead of a quantum well active layer. Moreover, the active layer or the hereto-barrier layer or both may be made of an AlGaInP mixed crystal.

In addition, the semiconductor laser device of the present invention may also be produced by using other mixed crystals such as an InGaAs mixed crystal as long as it is possible to form a strained hetero-barrier layer having a lattice mismatch. Furthermore, the semiconductor laser device of the present invention may be produced by a crystal growth method other than molecular beam epitaxy.

According to the present invention, the p-type hetero-barrier layer which is made of a mixed crystal strained by compression is disposed in contact with the active layer, whereby a potential barrier to the electrons in the active layer can be increased. Thus, the carrier overflow is reduced effectively, resulting in the high output operation of the semiconductor laser device.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor laser device comprising a substrate; a double hetero structure formed on an upper face of the substrate, the double hetero structure including an n-type cladding layer, an active layer, and a p-type cladding layer; and electrodes formed on a lower face of the substrate and on an upper face of the double hetero structure, wherein the double hetero structure further includes a p-type hetero-barrier layer formed between the p-type cladding layer and the active layer, the p-type hetero-barrier layer being in contact with the active layer, and the p-type hetero-barrier layer is strained by compression due to a lattice mismatch, and wherein all of the layers of the double hetero structure, except for the p-type hetero-barrier layer, lattice-match with the substrate.

2. A semiconductor laser device according to claim 1, further comprising an n-type side barrier layer between the n-type cladding layer and the active layer, and a p-type side barrier layer between the p-type hetero-barrier layer and the p-type cladding layer, wherein the active layer has a quantum well structure.

3. A semiconductor laser device according to claim 1, wherein the active layer and the p-type hetero-barrier layer are respectively made of an AlGaInP-type semiconductor.

4. A semiconductor laser device according to claim 1, wherein the thickness of the p-type hereto-barrier layer is in the range of about 10 nm to about 30 nm.

5. A semiconductor laser device according to claim 1, wherein the lattice mismatch is in the range of about 0.2% to about 2%.

6. A semiconductor laser device according to claim 1, wherein the n-type cladding layer is disposed between the active layer and the substrate.

7. A semiconductor laser device comprising an n-type substrate; an n-type cladding layer formed on an upper face of the n-type substrate; an n-type side barrier layer formed on an upper face of the n-type cladding layer; an undoped active layer formed on an upper face of the n-type side barrier layer, the undoped active layer having a quantum well structure; a p-type hereto-barrier layer formed on an upper face of the undoped active layer; a p-type side barrier layer formed on an upper face of the p-type hereto-barrier layer; a p-type cladding layer formed on an upper face of the p-type side barrier layer; a p-type contact layer formed on an upper face of the p-type cladding layer; and electrodes formed on a lower face of the n-type substrate and on an upper face of the p-type contact layer, wherein the p-type hetero-barrier layer is strained by compression due to a lattice mismatch.

* * * * *